(12) United States Patent
Pan et al.

(10) Patent No.: US 9,443,610 B1
(45) Date of Patent: Sep. 13, 2016

(54) LEAKAGE CURRENT DETECTION

(71) Applicant: MICRON TECHNOLOGY, INC., Boise, ID (US)

(72) Inventors: Feng Pan, Fremont, CA (US); Shigekazu Yamada, Tokyo (JP); Allahyar Vahidimowlavi, San Jose, CA (US); Jae-Kwan Park, Cupertino, CA (US); Cairong Hu, San Jose, CA (US); Kalyan Kavalipurapu, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/730,372

(22) Filed: Jun. 4, 2015

(51) Int. Cl.
*G11C 29/00* (2006.01)
*G11C 29/02* (2006.01)
*G11C 29/50* (2006.01)
*G01R 31/02* (2006.01)

(52) U.S. Cl.
CPC ............ *G11C 29/025* (2013.01); *G01R 31/025* (2013.01); *G11C 29/50* (2013.01); *G11C 2029/5006* (2013.01)

(58) Field of Classification Search
CPC ... G11C 2229/00; G11C 29/00; G11C 29/08; G11C 29/12; G11C 29/48; G11C 29/50
USPC ............................................. 365/201, 185.17
See application file for complete search history.

(56) References Cited

U.S. PATENT DOCUMENTS

| 8,514,630 | B2 | 8/2013 | Huynh et al. |
| 8,588,007 | B2 | 11/2013 | Yamada |
| 8,634,264 | B2 | 1/2014 | Yamada |
| 2009/0273386 | A1* | 11/2009 | Korobeynikov ....... G06G 7/186 327/337 |

OTHER PUBLICATIONS

Kessenich, et al.; "Program Operations With Embedded Leak Checks"; U.S. Appl. No. 14/302,782, filed Jun. 12, 2014; Total pp. 39.

* cited by examiner

*Primary Examiner* — Huan Hoang
(74) *Attorney, Agent, or Firm* — Dicke, Billig & Czaja, PLLC

(57) ABSTRACT

A system includes a first switch, an amplifier, a second switch, and a capacitor. The first switch is electrically coupled between a first reference voltage and a node. The amplifier has a first input, a second input, and an output, the amplifier to receive a second reference voltage on the first input and a sample voltage on the second input. The second switch is electrically coupled between the output of the amplifier and the second input of the amplifier. The capacitor is electrically coupled between the second input of the amplifier and the node. The first switch and the second switch are closed to initialize the node to the first reference voltage and to initialize the amplifier in unity-gain configuration. The first switch and the second switch are opened to detect a leakage current by sensing a change in the sample voltage.

23 Claims, 12 Drawing Sheets

LEAKAGE CURRENT DETECTION

TECHNICAL FIELD

The present disclosure relates generally to leakage current detection, in particular, in one or more embodiments, the present disclosure relates to leakage current detection in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Detecting the leakage current of different circuitry, such as select lines and word lines, of a memory device may be used to detect defects within the memory device. The defects that may be detected include, for example, word line to word line shorting or word line to substrate shorting. The leakage current of the different circuitry of the memory device may be detected using a probe test at the wafer level using leakage current detection circuitry built into each die of the wafer. The leakage current detection circuitry should use a minimum of die area and accurately detect leakage currents.

For the reasons stated above, and for other reasons stated below which will become apparent to those skilled in the art upon reading and understanding the present specification, there is a need in the art for alternative methods for leakage current detection, and system and apparatus to perform such methods.

DETAILED DESCRIPTION

Figure 1:
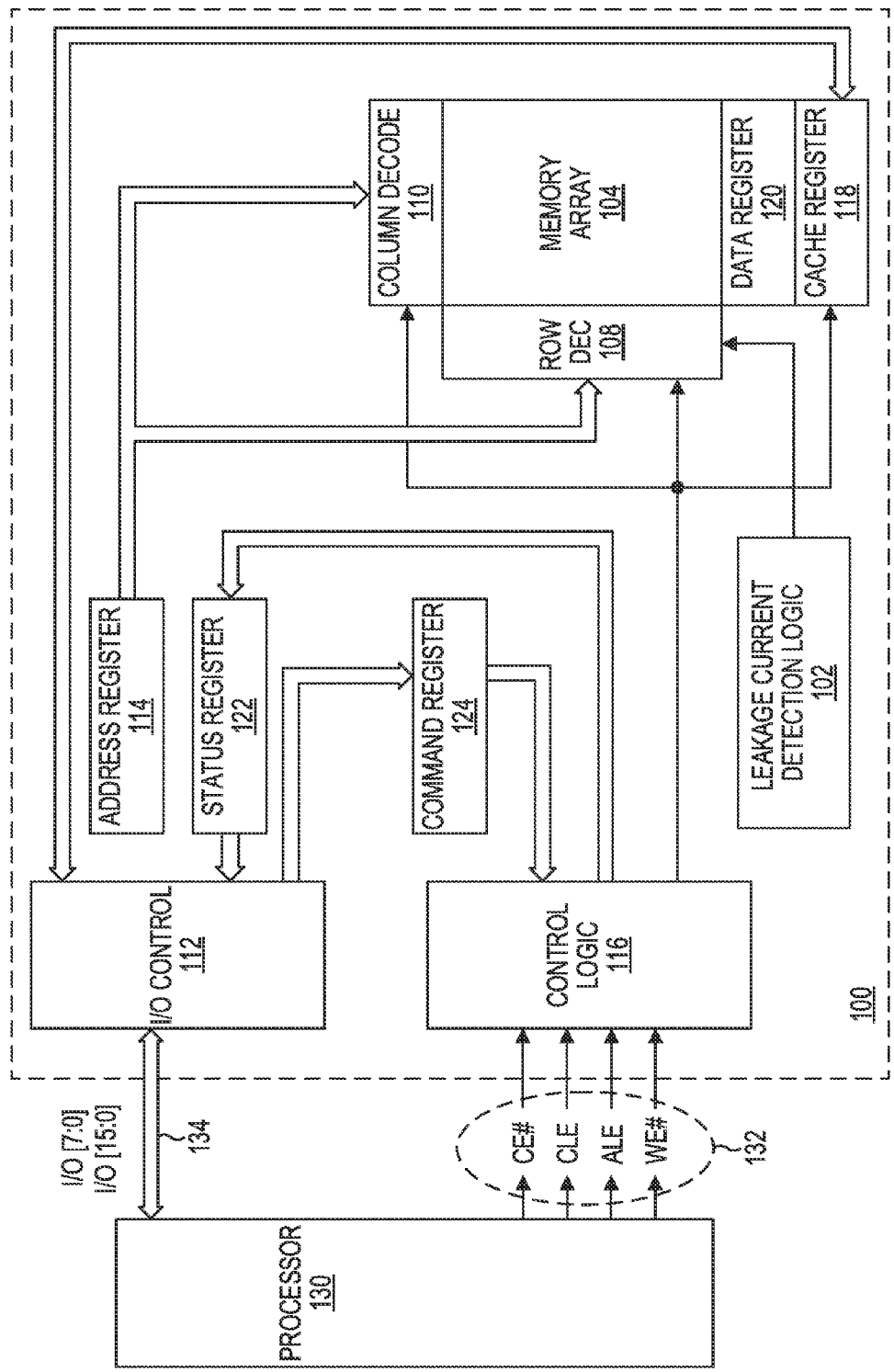
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Leakage current detection is used during wafer level probe tests to detect defects within a memory device. The circuitry used to detect the leakage current is built into each die of the wafer. Accordingly, this disclosure describes embodiments for achieving high accuracy in the detection of leakage current while using less die area.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes leakage current detection logic 102. Leakage current detection logic 102 may include a controller and other circuitry for detecting the leakage current of various circuitry of memory device 100. In one example, leakage current detection logic 102 sequentially detects the leakage current of each select line and word line of memory array 104 to detect defects within the memory array. Leakage current detection logic 102 provides leakage current detection with high accuracy while utilizing a small area of the die of memory device 100.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
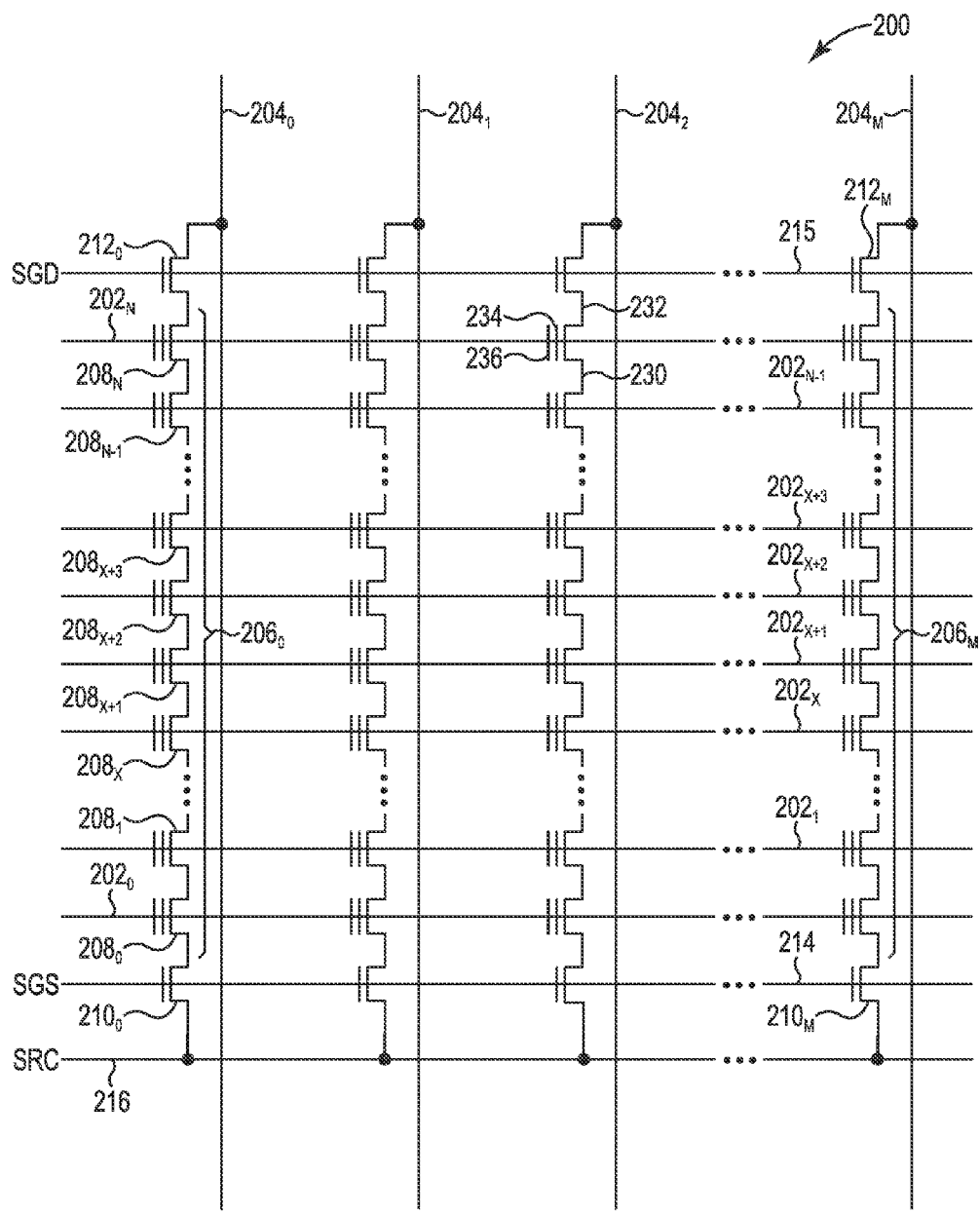
FIG. 2 is a schematic of a portion of an array of memory cells as could be used in a memory device of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$, $204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
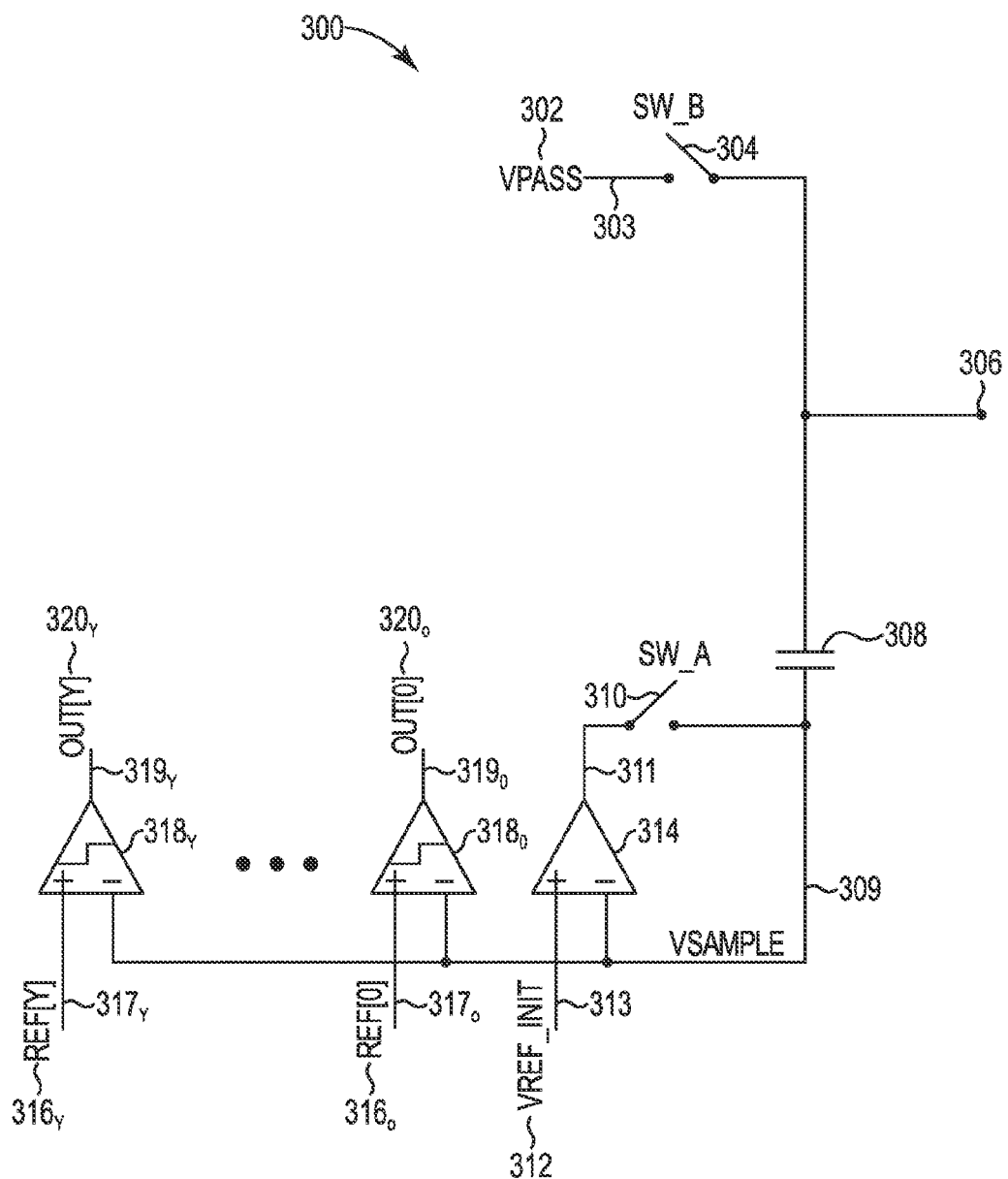
FIG. 3 is a schematic diagram illustrating one embodiment of a leakage current detection circuit.

FIG. 3 is a schematic diagram illustrating one embodiment of a leakage current detection circuit 300. Leakage current detection circuit 300 includes a first switch (SW_B) 304, a second switch (SW_A) 310, a capacitor 308 (e.g., 1 pF), an operational amplifier 314, and a plurality of comparators $318_0$ to $318_Y$ (e.g., operational amplifiers). One side of switch 304 is electrically coupled to a first reference voltage (VPASS) 302 (e.g., 15V) through a signal path 303, and the other side of switch 304 is electrically coupled to node 306. Node 306 is electrically coupled to one side of capacitor 308, and the other side of capacitor 308 is electrically coupled to one side of switch 310, the inverting input of operational amplifier 314, and the inverting input of each comparator $318_0$ to $318_Y$ through a sample voltage (VSAMPLE) signal path 309. The other side of switch 310 is electrically coupled to the output of operational amplifier 314 through a signal path 311. The non-inverting input of operational amplifier 314 is electrically coupled to a second reference voltage (VREF_INIT) 312 (e.g., 1V) through a signal path 313.

The non-inverting input of each comparator $318_0$ to $318_Y$ is electrically coupled to a reference voltage (REF[0] to REF[Y]) $316_0$ to $316_Y$ (e.g., 0.9V to 1.1V with 0.01V step) through a signal path $317_0$ to $317_Y$, respectively. The output of each comparator $318_0$ to $318_Y$ provides an output voltage (OUT[0] to OUT[Y]) $320_0$ to $320_Y$ through a signal path $319_0$ to $319_Y$, respectively. Comparators $318_0$ to $318_Y$ provide an analog-to-digital converter (ADC) to convert VSAMPLE to a digital value. The number of comparators "Y" is selected based on a desired resolution of the ADC.

With switch 304 closed (i.e., conducting), reference voltage 302 is connected to node 306 to initialize the voltage on node 306 to VPASS. In one example, a capacitance of a circuit electrically coupled to node 306 is charged in response to switch 304 being closed. With switch 310 closed (i.e., conducting), operational amplifier 314 is set in unity-gain configuration such that VSAMPLE substantially equals VREF_INIT. With switches 304 and 310 open (i.e., not conducting), the leakage current of a circuit electrically coupled to node 306 may be detected by sensing a change in VSAMPLE. In one example, in response to a circuit electrically coupled to node 306 having a leakage current, the voltage at node 306 will decrease, which in turn will cause VSAMPLE to decrease proportionally. The change in VSAMPLE is detected by comparators $318_0$ to $318_Y$, which convert VSAMPLE to a digital value that may be sampled by a controller or other suitable logic circuitry (not shown). The change in VSAMPLE is linearly proportional to the leakage current of the circuit electrically coupled to node 306.

Figure 4:
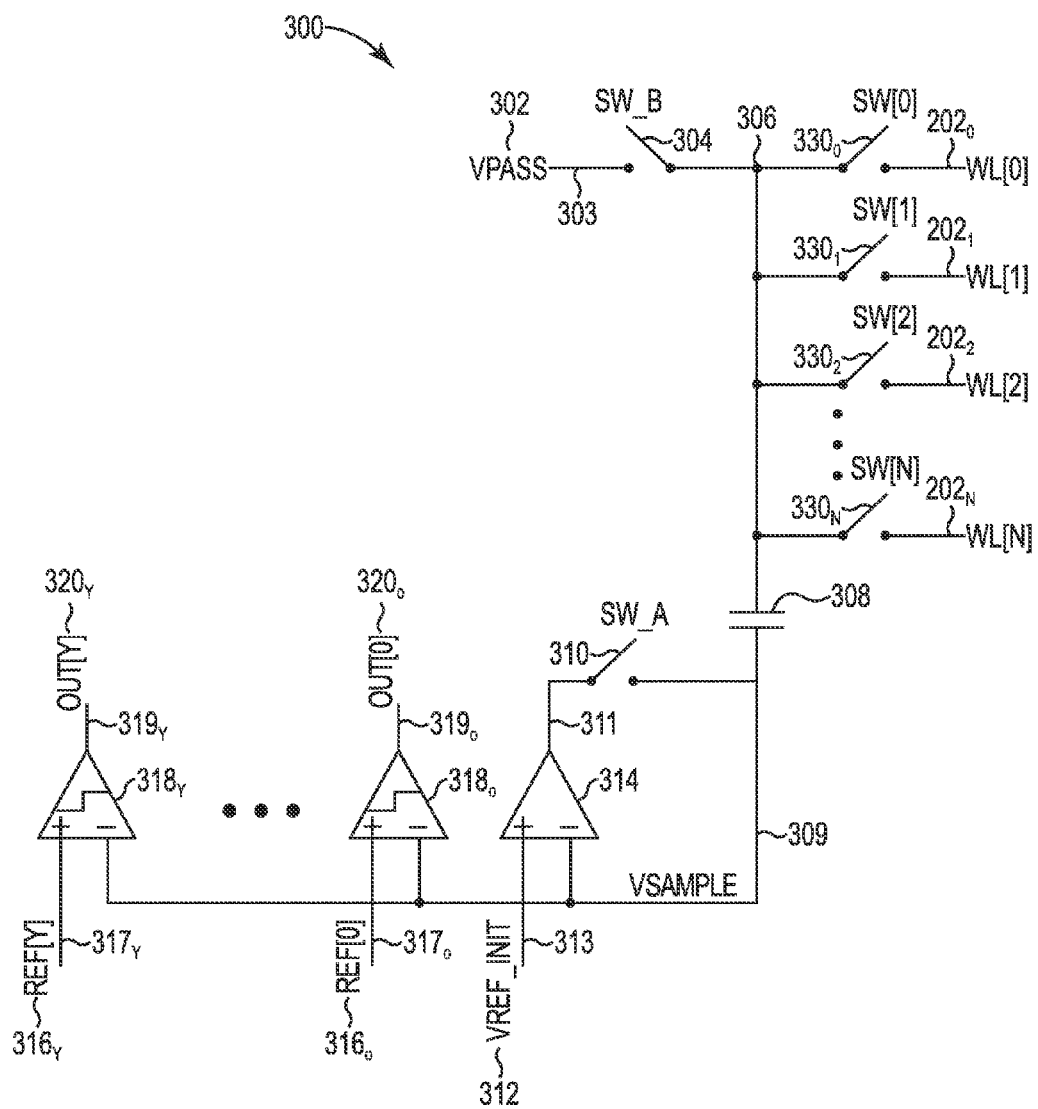
FIG. 4 is a schematic diagram illustrating one embodiment of a system including the leakage current detection circuit described with reference to FIG. 3.

FIG. 4 is a schematic diagram illustrating one embodiment of a system including the leakage current detection circuit 300 described with reference to FIG. 3. In addition to leakage current detection circuit 300 previously described and illustrated with reference to FIG. 3, the system includes a plurality of switches (SW[0] to SW[N]) $330_0$ to $330_N$ and word lines (WL[0] to WL[N]) $202_0$ to $202_N$. One side of each switch $330_0$ to $330_N$ is electrically coupled to node 306, and the other side of each switch $330_0$ to $330_N$ is electrically coupled to a word line $202_0$ to $202_N$, respectively. With switch 304 closed, each switch $330_0$ to $330_N$ is closed to connect each word line $202_0$ to $202_N$ to reference voltage 302 to initialize each word line $202_0$ to $202_N$ to VPASS. In one example, a capacitance of each word line $202_0$ to $202_N$ is charged in response to switch 304 and switches $330_0$ to $330_N$ being closed. With switches 304 and 310 open, the leakage current, if any, of each word line $202_0$ to $202_N$ may be detected by sequentially closing and opening one switch $330_0$ to $330_N$ at a time to detect a change in VSAMPLE for each word line.

Figure 5A:
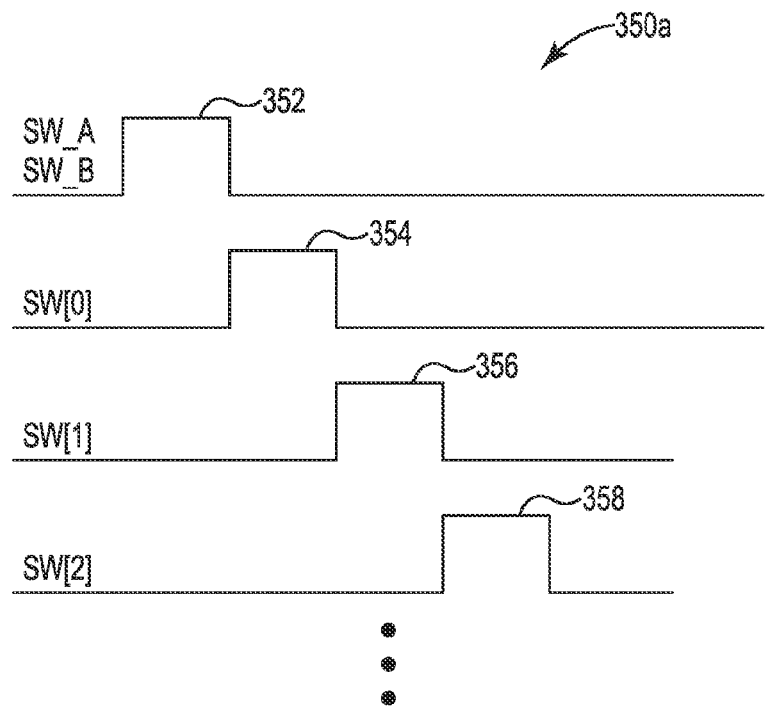
FIG. 5A is a timing diagram illustrating one embodiment of control signals for the leakage current detection phase of the leakage current detection circuit described with reference to FIG. 4.

FIG. 5A is a timing diagram 350a illustrating one embodiment of control signals for the leakage current detection phase of leakage current detection circuit 300 described with reference to FIG. 4. Timing diagram 350a may apply when the capacitance on VSAMPLE signal path 309 is relatively small compared to the capacitance of each word line $202_0$ to $202_N$. Prior to the leakage current detection phase shown in FIG. 5A, switches 304, 310, and $330_0$ to $330_N$ are closed during an initialization phase to initialize each word line $202_0$ to $202_N$ to VPASS and to initialize operational amplifier 314 in unity-gain configuration. Switches $330_0$ to $330_N$ are then opened during a development phase to develop a signal on each word line $202_0$ to $202_N$. During the development phase, switches 304 and 310 may remain closed as indicated at 352 in timing diagram 350a. Once the development phase is complete, switches 304 and 310 are opened and the leakage current detection phase begins.

As indicated at 354, switch $330_0$ is closed to detect the leakage current of word line $202_0$. In one example, switch $330_0$ is closed for 1 μs or another suitable time. If there is a leakage current on word line $202_0$, the voltage on node 306 and VSAMPLE will decrease. If there is no leakage current on word line $202_0$, the voltage on node 306 and VSAMPLE will remain substantially constant. After a sampling time (e.g., less than 1 μs such as 0.5 μs) from the closing of switch $330_0$, the digital value of VSAMPLE provided by comparators $318_0$ to $318_Y$ is sampled by a controller or other suitable logic circuitry to determine the leakage current, if any, of word line $202_0$. After detecting the leakage current, if any, of word line $202_0$, switch $330_0$ is opened and switch $330_1$ is closed as indicated at 356 to detect the leakage current of word line $202_1$. After detecting the leakage current, if any, of word line $202_1$, switch $330_1$ is opened and switch $330_2$ is closed as indicated at 358 to detect the leakage current of word line $202_2$. The process then repeats for each remaining word line $202_3$ to $202_N$ until the leakage current, if any, of each word line $202_0$ to $202_N$ has been detected.

Figure 5B:
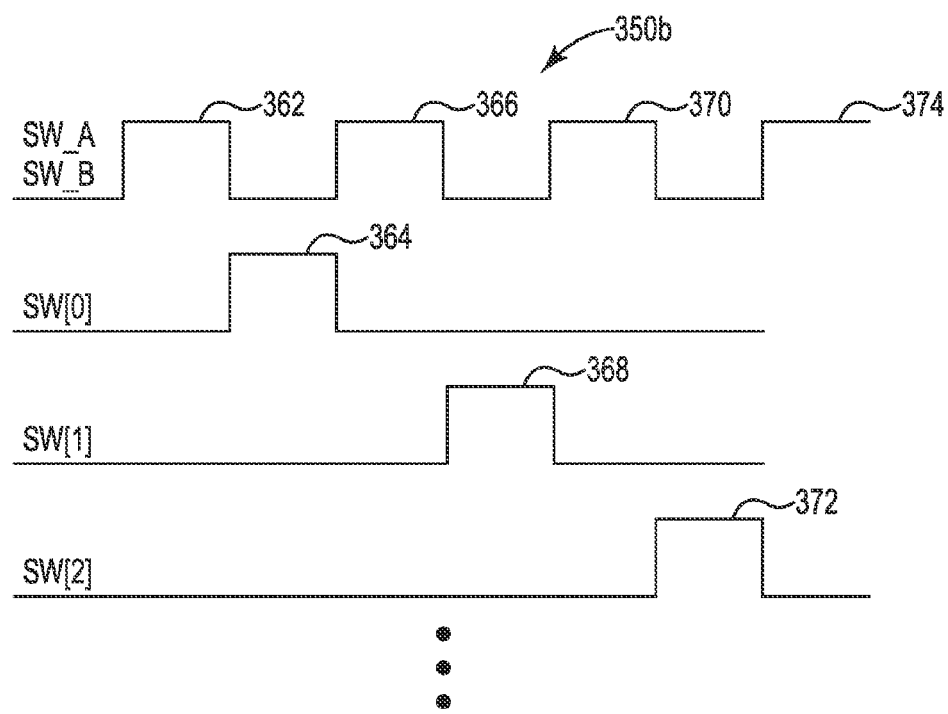
FIG. 5B is a timing diagram illustrating another embodiment of control signals for the leakage current detection phase of the leakage current detection circuit described with reference to FIG. 4.

FIG. 5B is a timing diagram 350b illustrating another embodiment of control signals for the leakage current detection phase of leakage current detection circuit 300 described with reference to FIG. 4. Timing diagram 350b may apply when the capacitance on VSAMPLE signal path 309 is relatively large compared to the capacitance of each word line $202_0$ to $202_N$ such that sampling error could be introduced if refreshing is not implemented. Prior to the leakage current detection phase shown in FIG. 5B, switches 304, 310, and $330_0$ to $330_N$ are closed during an initialization phase to initialize each word line $202_0$ to $202_N$ to VPASS and to initialize operational amplifier 314 in unity-gain configuration. Switches $330_0$ to $330_N$ are then opened during a development phase to develop a signal on each word line $202_0$ to $202_N$. During the development phase, switches 304 and 310 may remain closed as indicated at 362 in timing diagram 350b. Once the development phase is complete, switches 304 and 310 are opened and the leakage current detection phase begins.

As indicated at 364, switch $330_0$ is closed to detect the leakage current of word line $202_0$. In one example, switch $330_0$ is closed for 1 μs or another suitable time. If there is a leakage current on word line $202_0$, the voltage on node 306 and VSAMPLE will decrease. If there is no leakage current on word line $202_0$, the voltage on node 306 and VSAMPLE will remain substantially constant. After a sampling time (e.g., less than 1 μs such as 0.5 μs) from the closing of switch $330_0$, the digital value of VSAMPLE provided by comparators $318_0$ to $318_Y$ is sampled by a controller or other suitable logic circuitry to determine the leakage current, if any, of word line $202_0$. After detecting the leakage current, if any, of word line $202_0$, switch $330_0$ is opened and switches 304 and 310 are again closed as indicated at 366 to reinitialize node 306 to VPASS and to reinitialize operational amplifier 314 in unity-gain configuration.

After a reinitialization time (e.g., 1 μs), switches 304 and 310 are opened and switch $330_1$ is closed as indicated at 368 to detect the leakage current of word line $202_1$. After detecting the leakage current, if any, of word line $202_1$, switch $330_1$ is opened and switches 304 and 310 are again closed as indicated at 370 to reinitialize node 306 to VPASS and to reinitialize operational amplifier 314 in unity-gain configuration. Switches 304 and 310 are then opened and switch $330_2$ is closed as indicated at 372 to detect the leakage current of word line $202_2$. After detecting the leakage current, if any, of word line $202_2$, switch $330_2$ is opened and switches 304 and 310 are again closed as indicated at 374 to reinitialize node 306 to VPASS and to reinitialize operational amplifier 314 in unity-gain configuration. The process then repeats for each remaining word line $202_3$ to $202_N$ until the leakage current, if any, of each word line $202_0$ to $202_N$ has been detected.

Figure 6:
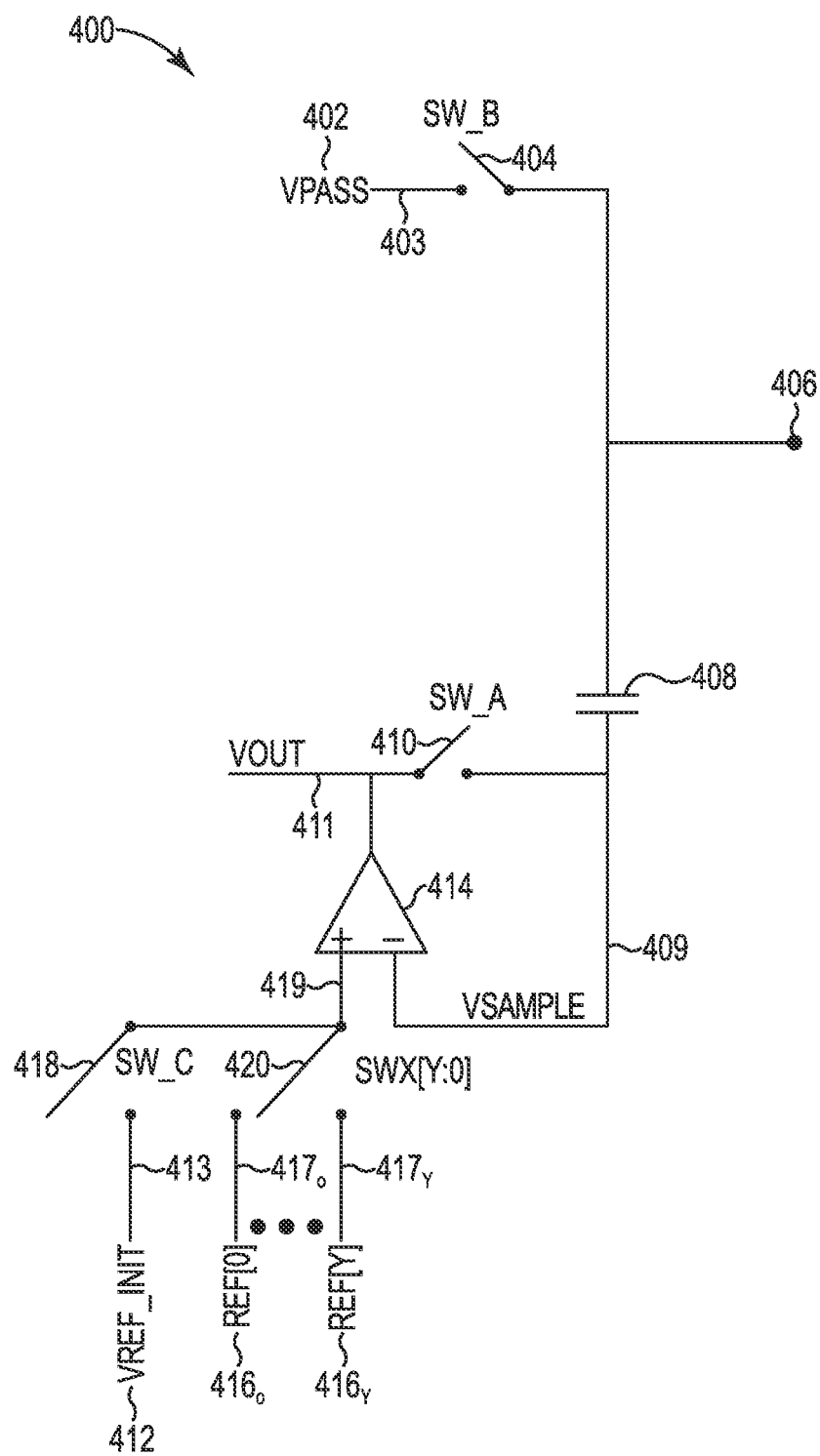
FIG. 6 is a schematic diagram illustrating another embodiment of a leakage current detection circuit.

FIG. 6 is a schematic diagram illustrating another embodiment of a leakage current detection circuit 400. Leakage current detection circuit 400 includes a first switch (SW_B) 404, a second switch (SW_A) 410, a capacitor 408 (e.g., 1 pF), an operational amplifier 414, a third switch (SW_C) 418, and a plurality of fourth switches (SWX[Y:0]) 420. One side of switch 404 is electrically coupled to a first reference voltage (VPASS) 402 (e.g., 15V) through a signal path 403, and the other side of switch 404 is electrically coupled to node 406. Node 406 is electrically coupled to one side of capacitor 408, and the other side of capacitor 408 is electrically coupled to one side of switch 410 and the inverting input of operational amplifier 414 through a sample voltage (VSAMPLE) signal path 409. The other side of switch 410 is electrically coupled to the output of operational amplifier 414 through a voltage output (VOUT) signal path 411. The non-inverting input of operational amplifier 414 is electrically coupled to one side of switch 418 and one side of each switch 420 through a signal path 419. The other side of switch 418 is electrically coupled to a reference voltage (VREF_INIT) 412 (e.g., 1V) through a signal path 413. The other side of each switch 420 is electrically coupled to a reference voltage (REF[0] to REF[Y]) $416_0$ to $416_Y$ (e.g., 0.9V to 1.1V with 0.01V step) through a signal path $417_0$ to $417_Y$, respectively.

With switch 404 closed (i.e., conducting), reference voltage 402 is connected to node 406 to initialize the voltage on node 406 to VPASS. In one example, a capacitance of a circuit electrically coupled to node 406 is charged in response to switch 404 being closed. With switches 410 and 418 closed (i.e., conducting) and switches 420 open (i.e., not conducting), operational amplifier 414 is initialized in unity-gain configuration such that VSAMPLE substantially equals VREF_INIT. With switches 404 and 410 open, the leakage current of a circuit electrically coupled to node 406 may be detected by sensing a change in VSAMPLE. In one example, in response to a circuit electrically coupled to node 406 having a leakage current, the voltage at node 406 will decrease, which in turn will cause VSAMPLE to decrease proportionally. The change in VSAMPLE is detected by operational amplifier 414 (now configured as a comparator), which sequentially compares VSAMPLE to each reference voltage $416_0$ to $416_Y$ to provide VOUT, which may be latched by a controller or other suitable logic circuitry such that VSAMPLE is converted to a digital value. The change in VSAMPLE is linearly proportional to the leakage current of the circuit electrically coupled to node 406.

Figure 7:
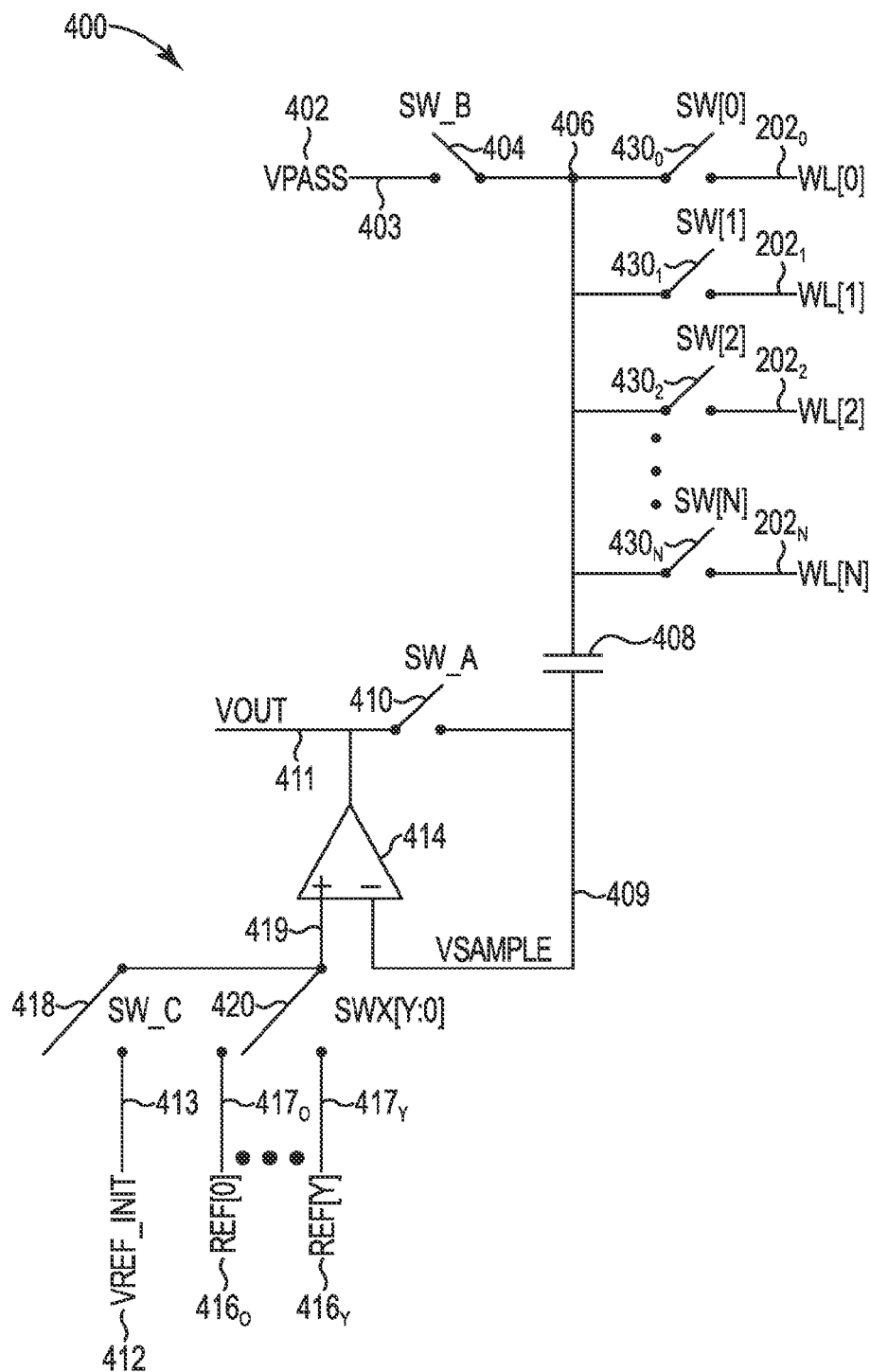
FIG. 7 is a schematic diagram illustrating one embodiment of a system including the leakage current detection circuit described with reference to FIG. 6.

FIG. 7 is a schematic diagram illustrating one embodiment of a system including leakage current detection circuit 400 described with reference to FIG. 6. In addition to leakage current detection circuit 400 previously described and illustrated with reference to FIG. 6, the system includes a plurality of switches (SW[0] to SW[N]) $430_0$ to $430_N$ and word lines (WL[0] to WL[N]) $202_0$ to $202_N$. One side of each switch $430_0$ to $430_N$ is electrically coupled to node 406, and the other side of each switch $430_0$ to $430_N$ is electrically coupled to a word line $202_0$ to $202_N$, respectively. With switch 404 closed, each switch $430_0$ to $430_N$ is closed to connect each word line $202_0$ to $202_N$ to reference voltage 402 to initialize each word line $202_0$ to $202_N$ to VPASS. In one example, a capacitance of each word line $202_0$ to $202_N$ is charged in response to switch 404 and switches $430_0$ to $430_N$ being closed. With switches 404 and 410 open, the leakage current, if any, of each word line $202_0$ to $202_N$ may be detected by sequentially closing and opening one switch $430_0$ to $430_N$ at a time to detect a change in VSAMPLE for each word line.

Figure 8A:
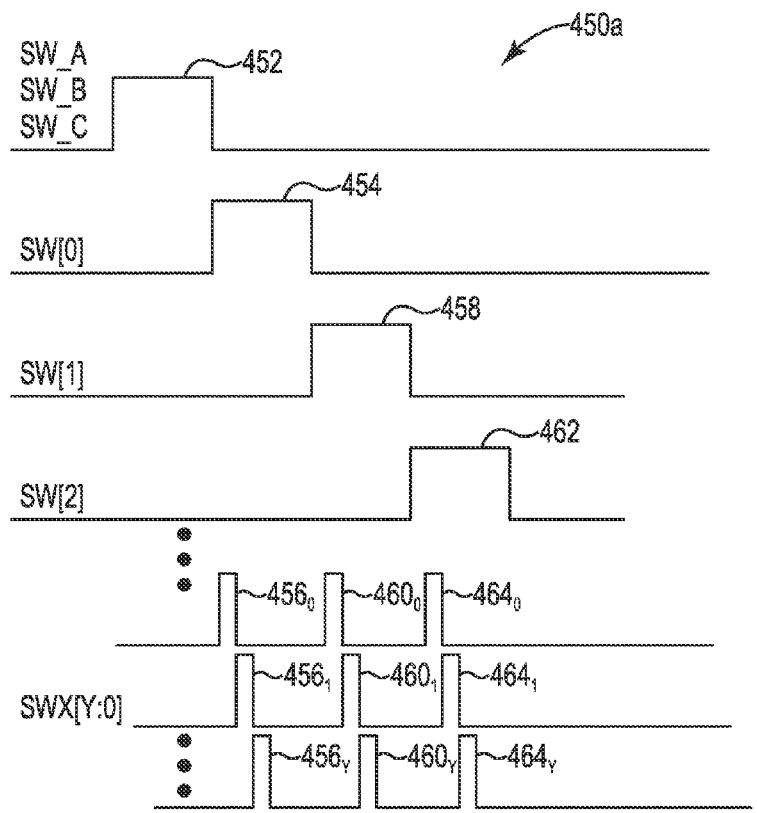
FIG. 8A is a timing diagram illustrating one embodiment of control signals for the leakage current detection phase of the leakage current detection circuit described with reference to FIG. 7.

FIG. 8A is a timing diagram 450a illustrating one embodiment of control signals for the leakage current detection phase of leakage current detection circuit 400 described with reference to FIG. 7. Timing diagram 450a may apply when the capacitance on VSAMPLE signal path 409 is relatively small compared to the capacitance of each word line $202_0$ to $202_N$. Prior to the leakage current detection phase shown in FIG. 8A, switches 404, 410, 418, and $430_0$ to $430_N$ are closed during an initialization phase to initialize each word line $202_0$ to $202_N$ to VPASS and to initialize operational amplifier 414 in unity-gain configuration. Switches $430_0$ to $430_N$ are then opened during a development phase to develop a signal on each word line $202_0$ to $202_N$. During the development phase, switches 404, 410, and 418 may remain closed as indicated at 452 in timing diagram 450a. Once the development phase is complete, switches 404, 410, and 418 are opened and the leakage current detection phase begins.

As indicated at 454, switch $430_0$ is closed to detect the leakage current of word line $202_0$. In one example, switch $430_0$ is closed for 1 µs or another suitable time. If there is a leakage current on word line $202_0$, the voltage on node 406 and VSAMPLE will decrease. If there is no leakage current on word line $202_0$, the voltage on node 406 and VSAMPLE will remain substantially constant. After a sampling time (e.g., less than 1 µs such as 0.5 µs) from the closing of switch $430_0$, the digital value of VSAMPLE is provided by operational amplifier 414 (configured as a comparator) by sequentially toggling each switch 420 as indicated at $456_0$, $456_1$ to $456_Y$ to sequentially pass each reference voltage $416_0$ to $416_Y$ to operational amplifier 414. The output VOUT of operational amplifier 414 is latched or sampled by a controller or other suitable logic circuitry to determine the leakage current, if any, of word line $202_0$.

After detecting the leakage current, if any, of word line $202_0$, switch $430_0$ is opened and switch $430_1$ is closed as indicated at 458 to detect the leakage current of word line $202_1$. After detecting the leakage current, if any, of word line $202_1$ via operational amplifier 414 by sequentially toggling each switch 420 as indicated at $460_0$, $460_1$ to $460_Y$, switch $430_1$ is opened and switch $430_2$ is closed as indicated at 462 to detect the leakage current of word line $202_2$. After detecting the leakage current, if any, of word line $202_2$ via operational amplifier 414 by sequentially toggling each switch 420 as indicated at $464_0$, $464_1$ to $464_Y$, the process repeats until the leakage current, if any, of each word line $202_0$ to $202_N$ has been detected.

Figure 8B:
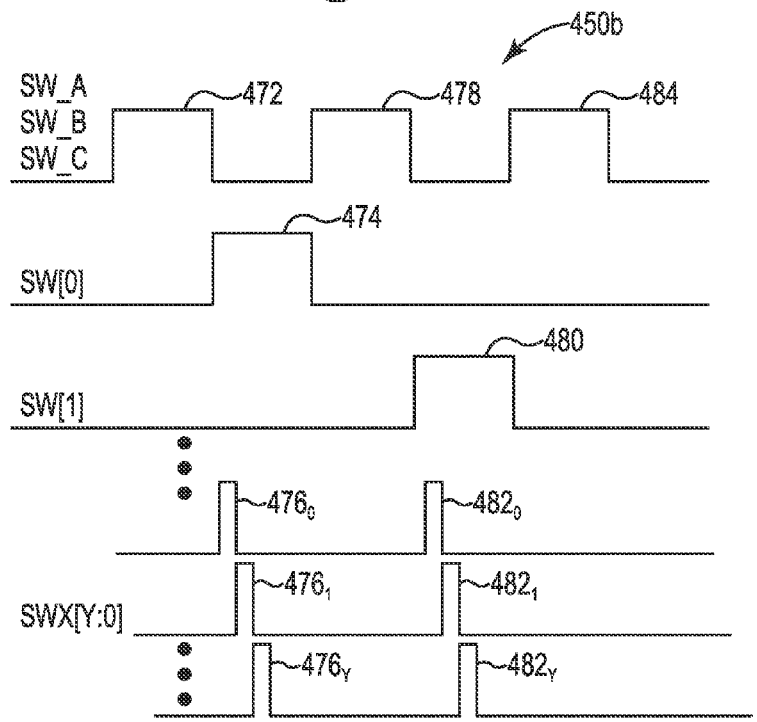
FIG. 8B is a timing diagram illustrating another embodiment of control signals for the leakage current detection phase of the leakage current detection circuit described with reference to FIG. 7.

FIG. 8B is a timing diagram 450b illustrating another embodiment of control signals for the leakage current detection phase of leakage current detection circuit 400 described with reference to FIG. 7. Timing diagram 450b may apply when the capacitance on VSAMPLE signal path 409 is relatively large compared to the capacitance of each word line $202_0$ to $202_N$ such that sampling error could be introduced if refreshing is not implemented. Prior to the leakage current detection phase shown in FIG. 8B, switches 404, 410, 418, and $430_0$ to $430_N$ are closed during an initialization phase to initialize each word line $202_0$ to $202_N$ to VPASS and to initialize operational amplifier 414 in unity-gain configuration. Switches $430_0$ to $430_N$ are then opened during a development phase to develop a signal on each word line $202_0$ to $202_N$. During the development phase, switches 404, 410, and 418 may remain closed as indicated at 472 in timing diagram 450b. Once the development phase is complete, switches 404, 410, and 418 are opened and the leakage current detection phase begins.

As indicated at 474, switch $430_0$ is closed to detect the leakage current of word line $202_0$. In one example, switch $430_0$ is closed for 1 µs or another suitable time. If there is a leakage current on word line $202_0$, the voltage on node 406 and VSAMPLE will decrease. If there is no leakage current on word line $202_0$, the voltage on node 406 and VSAMPLE will remain substantially constant. After a sampling time (e.g., less than 1 µs such as 0.5 µs) from the closing of switch $430_0$, the digital value of VSAMPLE is provided by operational amplifier 414 (configured as a comparator) by sequentially toggling each switch 420 as indicated at $476_0$, $476_1$ to $476_Y$ to sequentially pass each reference voltage $416_0$ to $416_Y$ to operational amplifier 414. The output VOUT of operational amplifier 414 is latched or sampled by a controller or other suitable logic circuitry to determine the leakage current, if any, of word line $202_0$.

After detecting the leakage current, if any, of word line $202_0$, switch $430_0$ is opened and switches 404, 410, and 418 are again closed as indicated at 478 to reinitialize node 406 to VPASS and to reinitialize operational amplifier 414 in unity-gain configuration. After a reinitialization time (e.g., 1 µs), switches 404, 410, and 418 are opened and switch $430_1$ is closed as indicated at 480 to detect the leakage current of word line $202_1$. After detecting the leakage current, if any, of word line $202_1$ by sequentially toggling each switch 420 as indicated at $482_0$, $482_1$ to $482_Y$, switch $430_1$ is opened and switches 404, 410, and 418 are again closed as indicated at 484 to reinitialize node 406 to VPASS and to reinitialize operational amplifier 414 in unity-gain configuration. The process then repeats for each remaining word line $202_2$ to $202_N$ until the leakage current, if any, of each word line $202_0$ to $202_N$ has been detected.

Figure 9:
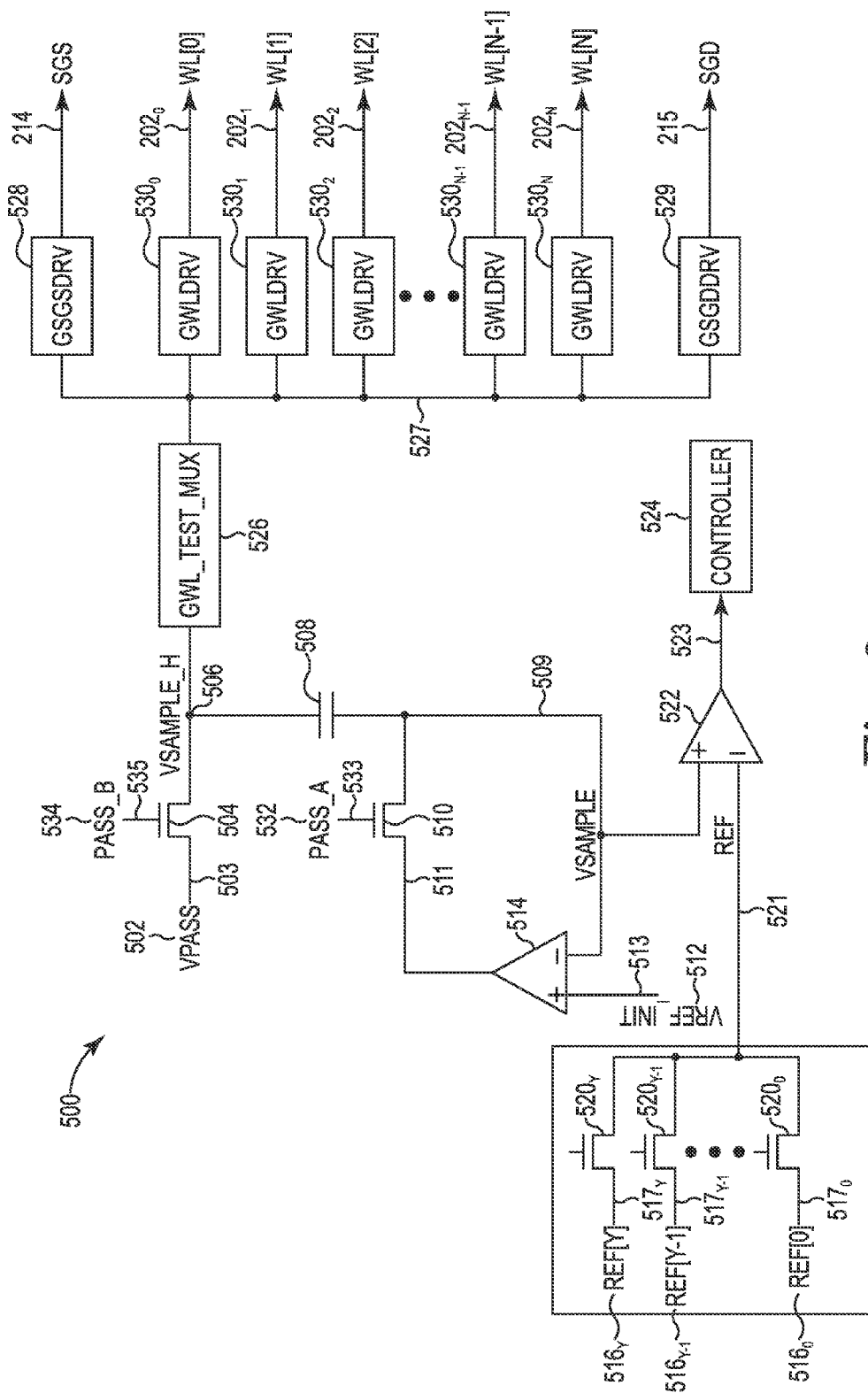
FIG. 9 is a schematic diagram illustrating another embodiment of a system including a leakage current detection circuit to detect word line leakage current, source select line leakage current, and drain select line leakage current.

FIG. 9 is a schematic diagram illustrating another embodiment of a system including a leakage current detection circuit 500 to detect word line leakage current, source select line leakage current, and drain select line leakage current. Leakage current detection circuit 500 includes a first transistor switch 504, a second transistor switch 510, a capacitor 508 (e.g., 1 pF), an operational amplifier 514, a plurality of transistor switches $520_0$ to $520_Y$, an comparator 522, a controller 524, a global word line test multiplexer (GWL_TEST_MUX) 526, a global source select line driver (GSGSDRV) 528, a global drain select line driver (GSGDDRV) 529, and global word line drivers (GWLDRV) $530_0$ to $530_N$.

One side of the source/drain path of transistor switch 504 is electrically coupled to a first reference voltage (VPASS) 502 (e.g., 15V) through a signal path 503. The gate of transistor switch 504 receives a control signal (PASS_B) 534 through a signal path 535. The other side of the source/drain path of transistor switch 504 is electrically coupled to node 506 through a high sample voltage (VSAMPLE_H) signal path. Node 506 is electrically coupled to one side of global word line test multiplexer 526 and one side of capacitor 508. The other side of capacitor 508 is electrically coupled to one side of the source/drain path of transistor switch 510, the inverting input of operational amplifier 514, and the non-inverting input of comparator 522 through a sample voltage (VSAMPLE) signal path 509. The gate of transistor switch 510 receives a control signal (PASS_A) 532 through a signal path 533. The other side of the source/drain path of transistor switch 510 is electrically coupled to the output of operational amplifier 514 through a signal path 511. The non-inverting input of operational amplifier 514 is electrically coupled to a second reference voltage (VREF_INIT) 512 (e.g., 1V) through a signal path 513. The output of comparator 522 is electrically coupled to controller 524 through a signal path 523. The inverting input of comparator 522 is electrically coupled to one side of the source/drain path of each transistor switch $520_0$ to $520_Y$ through a reference (REF) signal path 521. The other side of the source/drain path of each transistor switch $520_0$ to $520_Y$ is electrically coupled to a reference voltage (REF[0] to REF[Y]) $516_0$ to $516_Y$ (e.g., 0.9V to 1.1V with 0.01V step) through a signal path $517_0$ to $517_Y$, respectively.

The other side of global word line test multiplexer 526 is electrically coupled to one side of global source select line driver 528, one side of global drain select line driver 529, and one side of each global word line driver $530_0$ to $530_N$ through a signal path 527. The other side of global source select line driver 528 is electrically coupled to source select line 214. The other side of global drain select line driver 529 is electrically coupled to drain select line 215. The other side of each global word line driver $530_0$ to $530_N$ is electrically coupled to a word line $202_0$ to $202_N$, respectively. Global word line test multiplexer 526 includes circuitry to selectively electrically couple source select line 214, drain select line 215, and each word line $202_0$ to $202_N$ to node 506 via global source select line driver 528, global drain select line driver 529, and each global word line driver $530_0$ to $530_N$, respectively.

With transistor switch 504 closed (i.e., conducting), reference voltage 502 is connected to node 506 to initialize the voltage on node 506 to VPASS. With transistor switch 504 closed, global word line test multiplexer 526 connects source select line 214, drain select line 215, and each word line $202_0$ to $202_N$ to node 506 via global source select line driver 528, global drain select line driver 529, and each global word line driver $530_0$ to $530_N$ to initialize source select line 214, drain select line 215, and each word line $202_0$ to $202_N$ to VPASS, respectively. Transistor switch 510 is closed (i.e., conducting) to initialize operational amplifier 514 in unity-gain configuration such that VSAMPLE substantially equals VREF_INIT. With transistor switches 504 and 510 open (i.e., not conducting), the leakage current of source select line 214, drain select line 215, and each word line $202_0$ to $202_N$ may be detected by sequentially connecting source select line 214, drain select line 215, and each word line $202_0$ to $202_N$ to node 506 via global word line test multiplexer 526, global source select line driver 528, global drain select line driver 529, and each global word line driver $530_0$ to $530_N$, respectively, to detect a change in VSAMPLE. The change in VSAMPLE is detected by comparator 522, which sequentially compares VSAMPLE to each reference voltage $516_0$ to $516_Y$ to provide an output, which may be latched by controller 524 such that VSAMLE is converted to a digital value.

Figure 10:
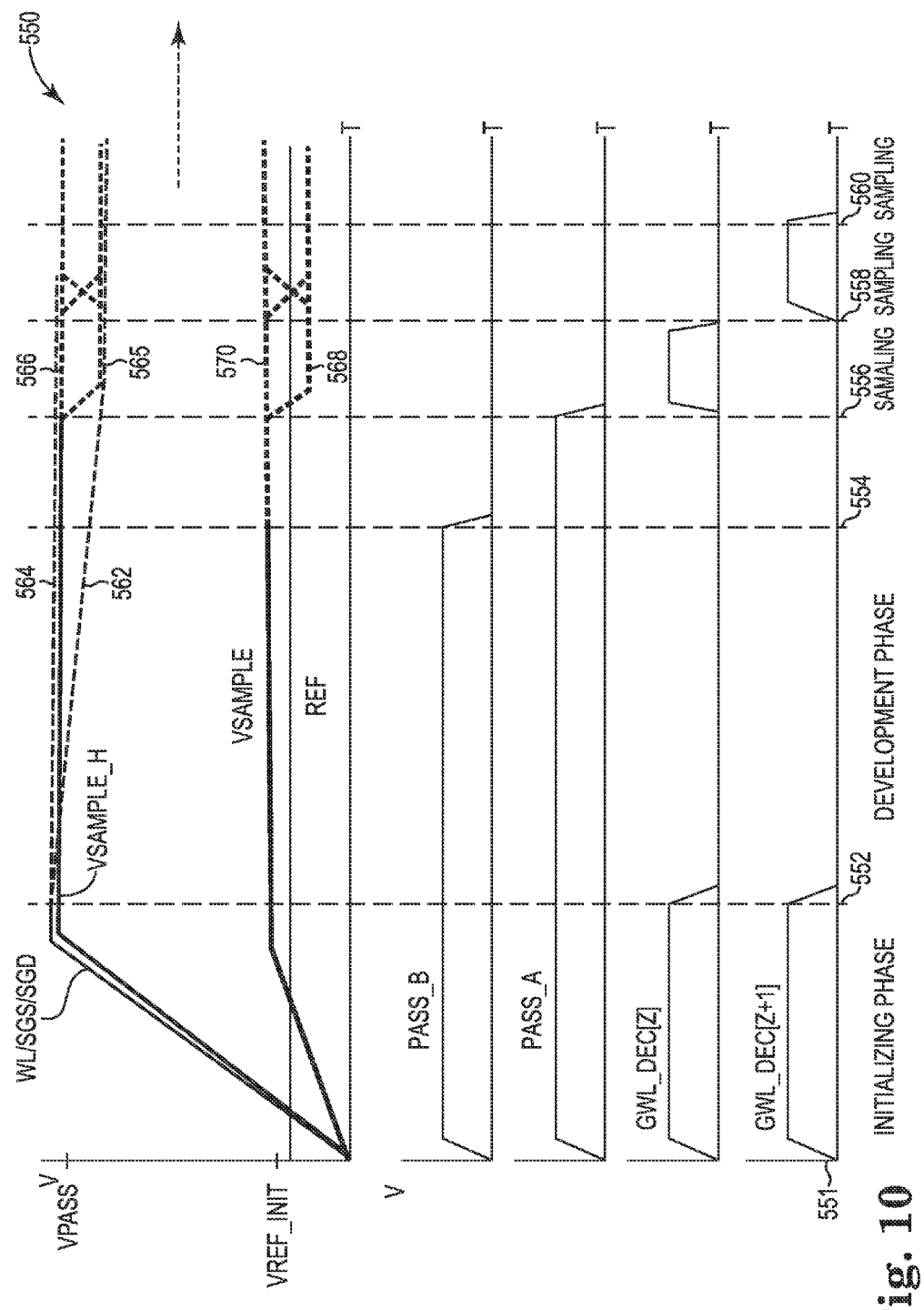
FIG. 10 is a timing diagram illustrating one embodiment of control signals and leakage current detection circuit signals during the operation of the leakage current detection circuit described with reference to FIG. 9.

FIG. 10 is a timing diagram 550 illustrating one embodiment of control signals and leakage current detection signals during the operation of leakage current detection circuit 500 described with reference to FIG. 9. In one example, the control signals are provided by controller 524. During an initializing phase between times 551 and 552 (e.g., 5 μs), transistor switches 504 and 510 are closed by setting the PASS_B and PASS_A signals to a logic high, respectively. Also during the initialization phase, global word line test multiplexer 526, global source select line driver 528, global drain select line driver 529, and each global word line driver $530_0$ to $530_N$ are configured by setting global word line decoder (GWL_DEC) signals, indicated for example by GWL_DEC[z] and GWL_DEC[z+1], to a logic high to connect node 506 to source select line 214, drain select line 215, and each word line $202_0$ to $202_N$. In response to the control signals during the initializing phase, source select line 214, drain select line 215, and each word line $202_0$ to $202_N$ is initialized to VPASS and operational amplifier 514 is set in unity-gain configuration. After the initializing phase at 552, VSAMPLE_H on node 506 and the voltage on source select line 214, drain select line 215, and each word line $202_0$ to $202_N$ substantially equals VPASS. Also after the initializing phase at 552, VSAMPLE substantially equals VREF_INIT.

During a development phase between times 552 and 556 (e.g., 5 μs), the global word line decoder signals are set to a logic low and global word line test multiplexer 526, global source select line driver 528, global drain select line driver 529, and each global word line driver $530_0$ to $530_N$ are configured to disconnect source select line 214, drain select line 215, and each word line $202_0$ to $202_N$ from node 506 to develop a signal on source select line 214, drain select line 215, and each word line $202_0$ to $202_N$. During the development phase, transistor switches 504 and 510 may remain closed. During the development phase, if there is a leakage current on a source select line 214, drain select line 215, or word line $202_0$ to $202_N$, the voltage on the respective source select line 214, drain select line 215, or word line $202_0$ to $202_N$ will decrease as indicated at 562. If there is substantially no leakage current on a source select line 214, drain select line 215, or word line $202_0$ to $202_N$, the voltage on the respective source select line 214, drain select line 215, or word line $202_0$ to $202_N$ will remain substantially constant as indicated at 564. Transistor switch 504 may be opened at time 544 prior to the opening of transistor switch 510 at time 556. In one example, transistor switch 504 may be opened 1 μs prior to the opening of transistor switch 510.

Once the development phase is complete, transistor switches 504 and 510 are opened and the leakage current detection phase begins. During a sampling phase between times 556 and 558, global word line test multiplexer 526, global source select line driver 528, global drain select line driver 529, and global word line drivers $530_0$ to $530_N$ are configured by setting a control signal, indicated for example by GWL_DEC[z], to a logic high to connect a selected source select line, drain select line, or word line corresponding to GWL_DEC[z] to node 506 to detect the leakage current of the selected source select line, drain select line, or word line.

If there is a leakage current on the selected source select line, drain select line, or word line, VSAMPLE_H and VSAMPLE will decrease as indicated at 565 and 568, respectively. If there is no leakage current on the selected source select line, drain select line, or word line, VSAMPLE_H and VSAMPLE will remain substantially constant as indicated at 566 and 570, respectively. After a sampling time from time 556, VSAMPLE is sequentially compared to each reference voltage $516_0$ to $516_Y$ by comparator 522 by sequentially toggling each switch $520_0$ to $520_Y$ and the result is passed to controller 524.

The leakage current detection phase continues by repeating the sampling phase for the next source select line, drain select line, or word line as indicated for example during another sampling phase between times 558 and 560. During the sampling phase between times 558 and 560, global word line test multiplexer 526, global source select line driver 528, global drain select line driver 529, and global word line drivers $530_0$ to $530_N$ are configured by setting a control signal, indicated for example by GWL_DEC[z+1], to a logic high to connect the next source select line, drain select line, or word line corresponding to GWL_DEC[z+1] to node 506 to detect the leakage current of the next source select line, drain select line, or word line. The sampling phase is repeated to detect a change in VSAMPLE for each source select line, drain select line, and word line. Based on the leakage current, it may be determined whether a source select line, drain select line, or word line has a defect.

Figure 11:
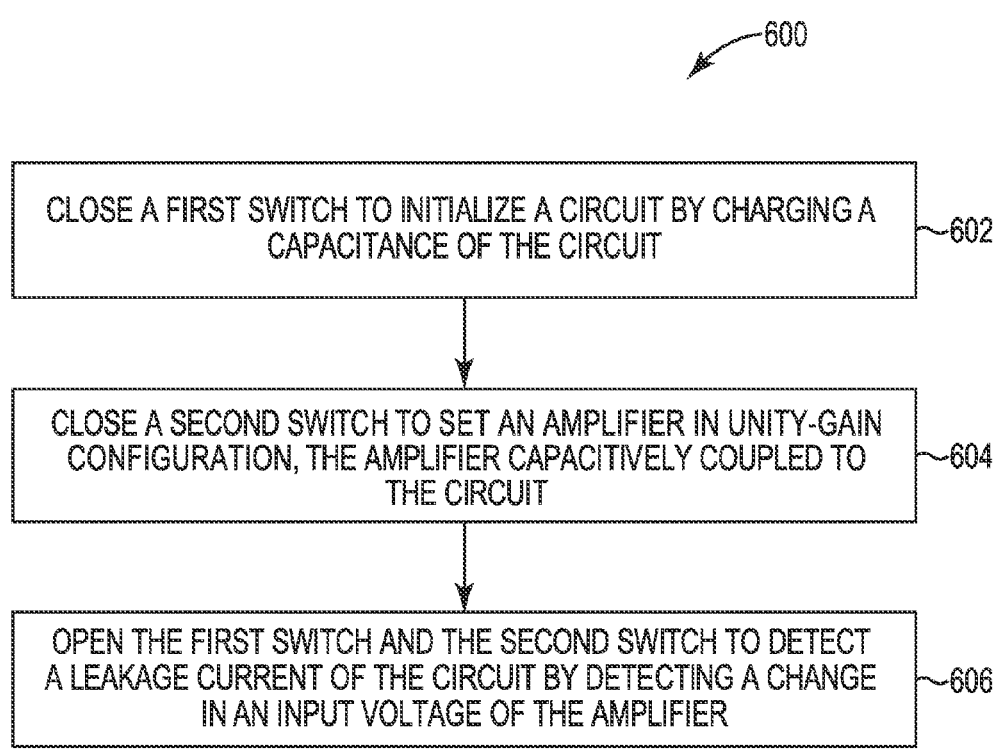
FIG. 11 is a flow diagram illustrating one embodiment of a method for detecting leakage current.

FIG. 11 is a flow diagram illustrating one embodiment of a method 600 for detecting leakage current. At 602, a first switch is closed to initialize a circuit by charging a capacitance of the circuit. At 604, a second switch is closed to set an amplifier in unity-gain configuration, where the amplifier is capacitively coupled to the circuit. At 606, the first switch and the second switch are opened to detect a leakage current of the circuit by detecting a change in an input voltage of the amplifier. In one example, method 600 further includes closing a third switch between the first switch and the circuit to initialize the circuit, opening the third switch prior to opening the first switch and the second switch, and closing the third switch after opening the first switch and the second switch to detect the leakage current of the circuit. Closing the first switch may electrically couple a reference voltage to the circuit. Closing the second switch may initialize an output voltage of the amplifier to a reference voltage. In one example, method 600 includes detecting a change in the input voltage by converting the input voltage to a digital value and sampling the digital value in response to a sampling time elapsing from the opening of the first switch and the second switch.

Figure 12:
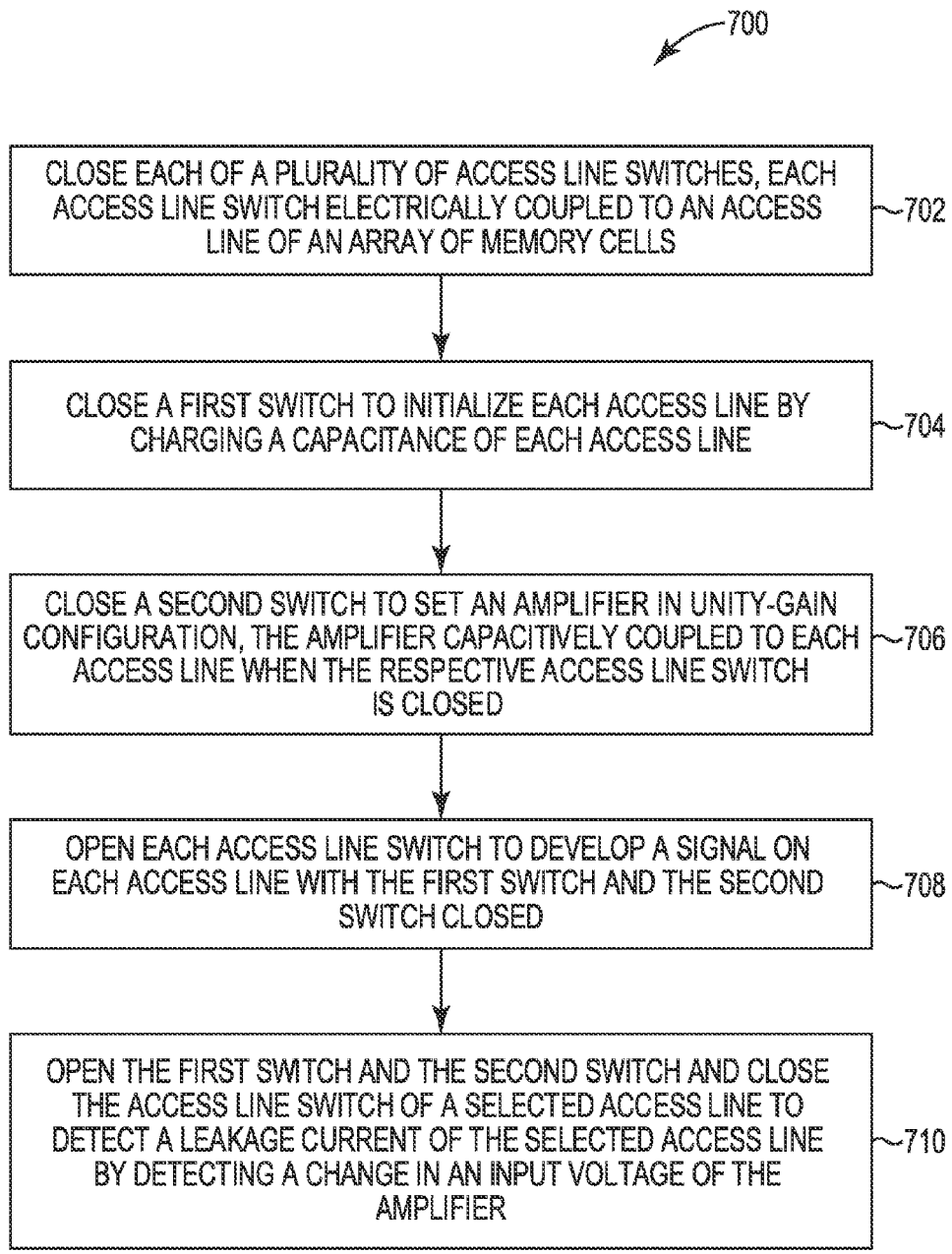
FIG. 12 is a flow diagram illustrating another embodiment of a method for detecting leakage current.

FIG. 12 is a flow diagram illustrating another embodiment of a method 700 for detecting leakage current. At 702, each of a plurality of access line switches is closed, where each access line switch is electrically coupled to an access line of an array of memory cells. At 704, a first switch is closed to initialize each access line by charging a capacitance of each access line. At 706, a second switch is closed to set an amplifier in unity-gain configuration, where the amplifier is capacitively coupled to each access line when the respective access line switch is closed. At 708, each access line switch is opened to develop a signal on each access line with the first switch and the second switch closed. At 710, the first switch and the second switch are opened and the access line switch of a selected access line is closed to detect a leakage current of the selected access line by detecting a change in an input voltage of the amplifier.

Detecting the change in the input voltage of the amplifier may include converting the input voltage to a digital value and sampling the digital value in response to a sampling time elapsing from the closing of the access line switch of the selected access line. In one example, method 700 further includes opening the access line switch of the selected access line and closing the access line switch of a further selected access line to detect a leakage current of the further selected access line by detecting a change in the input voltage of the amplifier. In another example, method 700 includes opening the access line switch of the selected access line, closing the first switch and the second switch to set the amplifier in unity-gain configuration, and opening the first switch and the second switch and closing the access line switch of a further selected access line to detect a leakage current of the further selected access line by detecting a change in the input voltage of the amplifier. Detecting the leakage current of the selected access line may include detecting a decrease in the input voltage proportional to the leakage current. Closing the second switch may initialize an output voltage of the amplifier to a reference voltage.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A system comprising:
   a first switch electrically coupled between a first node configured to receive a first reference voltage and a second node;
   an amplifier having a first input, a second input, and an output, the amplifier to receive a second reference voltage on the first input and a sample voltage on the second input;
   a second switch electrically coupled between the output of the amplifier and the second input of the amplifier;
   a capacitor electrically coupled between the second input of the amplifier and the second node; and
   a controller to control the first switch and the second switch;
   wherein the first switch and the second switch are closed to initialize the second node to the first reference voltage and to initialize the amplifier in unity-gain configuration, and
   wherein the first switch and the second switch are opened to detect a leakage current by sensing a change in the sample voltage.

2. The system of claim 1, further comprising:
   an analog-to-digital converter to convert the sample voltage to a digital value.

3. The system of claim 2, wherein the controller is to receive the digital value of the sample voltage.

4. The system of claim 1, wherein the second reference voltage is less than the first reference voltage.

5. The system of claim 1, wherein the first switch is closed to initialize a circuit electrically coupled to the second node by charging a capacitance of the circuit.

6. The system of claim 1, further comprising:
a third switch electrically coupled between the first input of the amplifier and the second reference voltage; and
a plurality of fourth switches electrically coupled between the first input of the amplifier and a plurality of third reference voltages to pass a selected one of the plurality of third reference voltages to the first input of the amplifier,
wherein the first switch, the second switch, and the third switch are closed to initialize the second node to the first reference voltage and to initialize the amplifier in unity-gain configuration, and
wherein the first switch, the second switch, and the third switch are opened to detect a leakage current by sensing a change in the sample voltage by sequentially passing, via the fourth switches, each of the third reference voltages to the first input of the amplifier to convert the sample voltage to a digital value via the amplifier.

7. A method comprising:
closing a first switch to initialize a circuit by charging a capacitance of the circuit;
closing a second switch to set an amplifier in unity-gain configuration, the amplifier capacitively coupled to the circuit; and
opening the first switch and the second switch to detect a leakage current of the circuit by detecting a change in an input voltage of the amplifier.

8. The method of claim 7, further comprising:
closing a third switch between the first switch and the circuit to initialize the circuit;
opening the third switch prior to opening the first switch and the second switch; and
closing the third switch after opening the first switch and the second switch to detect the leakage current of the circuit.

9. The method of claim 7, wherein closing the first switch electrically couples a reference voltage to the circuit.

10. The method of claim 7, wherein closing the second switch initializes an output voltage of the amplifier to a reference voltage.

11. The method of claim 7, further comprising:
detecting a change in the input voltage by converting the input voltage to a digital value and sampling the digital value in response to a sampling time elapsing from the opening of the first switch and the second switch.

12. A system comprising:
an array of memory cells comprising a plurality of access lines;
a plurality of access line switches, each access line switch to individually select an access line;
a first switch electrically coupled between a node configured to receive a first reference voltage and each of the access line switches;
an amplifier having a first input, a second input, and an output, the amplifier to receive a second reference voltage on the first input and a sample voltage on the second input;
a second switch electrically coupled between the output of the amplifier and the second input of the amplifier;
a capacitor electrically coupled between the second input of the amplifier and each access line switch; and
a controller to control the first switch, the second switch, and each access line switch;
wherein the first switch, the second switch, and each access line switch is closed to initialize the access lines to the first reference voltage and to initialize the amplifier in unity-gain configuration,
wherein the first switch and the second switch remain closed and each access line switch is opened to develop a signal on each access line, and
wherein the first switch and the second switch are opened and the access line switches are closed and opened sequentially to detect a leakage current of each access line by sensing a change in the sample voltage while each access line switch is closed.

13. The system of claim 12, further comprising:
an analog-to-digital converter to convert the sample voltage to a digital value.

14. The system of claim 13, wherein the controller is to receive the digital value of the sample voltage.

15. The system of claim 12, wherein the second reference voltage is less than the first reference voltage.

16. The system of claim 12, wherein the first switch is closed and each access line switch is closed to charge a capacitance of each access line.

17. The system of claim 12, further comprising:
a third switch electrically coupled between the first input of the amplifier and the second reference voltage;
a plurality of fourth switches electrically coupled between the first input of the amplifier and a plurality of nodes configured to receive corresponding third reference voltages to pass a selected one of the plurality of third reference voltages to the first input of the amplifier,
wherein the third switch is closed to initialize the amplifier in unity-gain configuration, and
wherein the third switch is opened to detect the leakage current of each access line by sensing, for each access line, a change in the sample voltage by sequentially passing, via the fourth switches, each of the third reference voltages to the first input of the amplifier to convert the sample voltage to a digital value via the amplifier.

18. A method comprising:
closing each of a plurality of access line switches, each access line switch electrically coupled to an access line of an array of memory cells;
closing a first switch to initialize each access line by charging a capacitance of each access line;
closing a second switch to set an amplifier in unity-gain configuration, the amplifier capacitively coupled to each access line when the respective access line switch is closed;
opening each access line switch to develop a signal on each access line with the first switch and the second switch closed; and
opening the first switch and the second switch and closing the access line switch of a selected access line to detect a leakage current of the selected access line by detecting a change in an input voltage of the amplifier.

19. The method of claim 18, wherein detecting the change in the input voltage of the amplifier comprises converting the input voltage to a digital value and sampling the digital value in response to a sampling time elapsing from the closing of the access line switch of the selected access line.

20. The method of claim 18, further comprising:
opening the access line switch of the selected access line; and
closing the access line switch of a further selected access line to detect a leakage current of the further selected access line by detecting a change in the input voltage of the amplifier.

21. The method of claim 18, further comprising:
opening the access line switch of the selected access line;
closing the first switch and the second switch to set the amplifier in unity-gain configuration; and
opening the first switch and the second switch and closing the access line switch of a further selected access line to detect a leakage current of the further selected access line by detecting a change in the input voltage of the amplifier.

22. The method of claim 18, wherein detecting the leakage current of the selected access line comprises detecting a decrease in the input voltage proportional to the leakage current.

23. The method of claim 18, wherein closing the second switch initializes an output voltage of the amplifier to a reference voltage.

* * * * *